(12) United States Patent
Sanfilippo et al.

(10) Patent No.: US 8,860,166 B2
(45) Date of Patent: Oct. 14, 2014

(54) PHOTO DETECTOR ARRAY OF GEIGER MODE AVALANCHE PHOTODIODES FOR COMPUTED TOMOGRAPHY SYSTEMS

(75) Inventors: Delfo Nunziato Sanfilippo, Catania (IT); Giovanni Condorelli, Misterbianco (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 351 days.

(21) Appl. No.: 13/460,007

(22) Filed: Apr. 30, 2012

(65) Prior Publication Data
US 2012/0267746 A1 Oct. 25, 2012

Related U.S. Application Data

(63) Continuation-in-part of application No. 13/053,595, filed on Mar. 22, 2011, now Pat. No. 8,723,100.

(30) Foreign Application Priority Data

Mar. 23, 2010 (IT) .............................. VA2010A0026

(51) Int. Cl.
*H01L 31/107* (2006.01)
*H01L 27/144* (2006.01)
*H01L 27/146* (2006.01)

(52) U.S. Cl.
CPC .......... *H01L 27/1446* (2013.01); *H01L 31/107* (2013.01); *H01L 27/14689* (2013.01)
USPC 257/438; 257/446; 257/E27.14; 257/E31.063; 438/91

(58) Field of Classification Search
CPC ..................... H01L 27/14643; H01L 27/1463; H01L 27/144; H01L 27/1446; H01L 27/14658; H01L 31/107; H01L 31/1075
USPC ............ 257/446, E31.063, E31.116, E27.14; 438/91
See application file for complete search history.

(56) References Cited

U.S. PATENT DOCUMENTS

| 7,262,402 | B2 | 8/2007 | Niclass et al. |
| 7,403,589 | B1 | 7/2008 | Short et al. |

(Continued)

FOREIGN PATENT DOCUMENTS

| EP | 1132724 A2 | 9/2001 |
| WO | WO0038248 A1 | 6/2000 |

OTHER PUBLICATIONS

Cova et al., "Avalanche Photodiodes and Quenching Circuits for Single-Photon Detection", Applied Optics, Optical Society of America, vol. 35, No. 12, pp. 1956-1976, Apr. 20, 1996.

(Continued)

*Primary Examiner* — Yu Chen
*Assistant Examiner* — Jeremy Joy
(74) *Attorney, Agent, or Firm* — Allen, Dyer, Doppelt, Milbrath & Gilchrist, P.A.

(57) ABSTRACT

The photo detector array is configured to generate pulses with short rise and fall times because each Geiger mode avalanche photodiode includes an anode contact, a cathode contact, an output contact electrically insulated from the anode and cathode contacts, a semiconductor layer, and at least one shield or metal structure in the semiconductor layer capacitively coupled to the semiconductor layer and coupled to the output contact. The output contacts of all Geiger mode avalanche photodiodes are connected in common and are configured to provide for detection of spikes correlated to avalanche events on any avalanche photodiode of the array.

20 Claims, 5 Drawing Sheets

(56) References Cited

U.S. PATENT DOCUMENTS

| | | | |
|---|---|---|---|
| 8,610,231 B2* | 12/2013 | Yamamura et al. | 257/438 |
| 2006/0255280 A1* | 11/2006 | Shibayama | 250/370.11 |
| 2008/0203309 A1 | 8/2008 | Frach et al. | |
| 2008/0317200 A1 | 12/2008 | Lecomte et al. | |
| 2009/0121142 A1* | 5/2009 | Heismann et al. | 250/363.04 |
| 2009/0184317 A1* | 7/2009 | Sanfilippo et al. | 257/49 |
| 2009/0184384 A1* | 7/2009 | Sanfilippo et al. | 257/432 |
| 2009/0185659 A1* | 7/2009 | Ishii et al. | 378/115 |
| 2010/0102242 A1 | 4/2010 | Burr et al. | |
| 2010/0148040 A1* | 6/2010 | Sanfilippo et al. | 250/214.1 |
| 2011/0095388 A1* | 4/2011 | Richter et al. | 257/432 |

OTHER PUBLICATIONS

Bonanno et al., "CMOS-APS for Astrophysical Applications", Memorie S.A.I.t. 2003, vol. 74, pp. 800-803.

Sciacca et al., "Silicon Planar Technology for Single-Photon Optical Detectors", IEEE Transaction, Electron Devices, vol. 50, No. 4, 8 pages. Apr. 2003.

Kripesh et al., Three-Dimensional System-in-Package Using Stacked Silicon Platform Technology, IEEE Transactions on Advanced Packaging, vol. 28, No. 3, Aug. 2005, pp. 377-386.

Mazzillo et al., "Single Photon Avalanche Photodiodes Arrays", Sensors and Actuators A 138 (2007), pp. 306-312.

\* cited by examiner

PHOTO DETECTOR ARRAY OF GEIGER MODE AVALANCHE PHOTODIODES FOR COMPUTED TOMOGRAPHY SYSTEMS

RELATED APPLICATIONS

This application is a Continuation-in-Part (CIP) application of copending U.S. patent application Ser. No. 13/053,595 filed Mar. 22, 2011, the entire disclosure of which is incorporated herein by reference.

FIELD OF THE INVENTION

The present application relates to semiconductor photodetectors and, more precisely, to an array of Geiger-mode avalanche photodiodes for a computed tomography system configured to count received photons and determine the energy of radiation impinging on the array.

BACKGROUND OF THE INVENTION

Computed Tomography (CT) is a known approach for obtaining images of the internal structure of a subject from its projections. CT has been shown to be an advancement compared to conventional radiography in the detection of a wide variety of diseases because of the greater contrast it achieves. However, CT involves a considerably greater amount of radiation than conventional radiography. See R. Lecomte, P. Berard, Cadorette, D. Lapointe, "Method and system for low radiation computer tomography", U.S. Publication No. 2008/0317200 A1, Dec. 25, 2008.

Typically, in radiographic imaging systems, such as x-ray and computed tomography (CT), an x-ray source emits x-rays toward a subject or object, such as a patient or a piece of luggage. The beam, after being attenuated by the subject, impinges upon an array of radiation detectors. The intensity of the attenuated beam radiation received at the detector array is typically dependent upon the attenuation of the x-rays. Each detector element of the detector array produces a separate electrical signal indicative of the attenuated beam received by each detector element. The electrical signals are transmitted to a data processing system for analysis which ultimately produces an image. See K. C. Burr, J. J. Shiang, A. J. Couture, "Multi-layer Radiation detector assembly", U.S. Publication No. 2010/0102242 A1, Apr. 29, 2010.

Conventional CT imaging systems utilize detectors that convert radiographic energy into current signals that are integrated over a time period, then measured and ultimately digitized. A drawback of such detectors however is their inability to provide data or feedback as to the number and/or energy of photons detected. During image reconstruction, data as to the number and/or energy of photons detected can be used to distinguish materials which appear identical in images reconstructed from conventional systems that do not provide this additional information. That is, conventional CT detectors have a scintillator component and photodiode component wherein the scintillator component illuminates upon reception of radiographic energy and the photodiode detects illumination of the scintillator component and provides an electrical signal as a function of the intensity of illumination. A drawback of these detectors is their inability to provide energy discriminatory data or otherwise count the number and/or measure the energy of photons actually received by a given detector element or pixel. That is, the light emitted by the scintillator is a function of the number of x-rays impinged as well as the energy level of the x-rays. Under the charge integration operation mode, the photodiode is not capable of discriminating between the energy level or the photon count from the scintillation. For example, two scintillators may illuminate with equivalent intensity and, as such, provide equivalent output to their respective photodiodes. Yet, the number of x-rays received by each scintillator may be different as well as the x-rays' energy, but yield an equivalent light output.

In attempts to design scintillator based detectors capable of photon counting and energy discrimination, detectors constructed from scintillators coupled to either avalanche photodiodes (APDs) or photomultipliers have also been used. However, there are varying problems that limit the use of these detectors. In the case of APDs, there is additional gain need to enable photon counting, but with associated gain-instability noise, temperature sensitivity, and other reliability issues. In the case of photomultiplier tubes, these devices are too large, mechanically fragile, and costly for high resolution detectors covering large areas as used in CT. As such, these photomultiplier tubes have been limited to use in PET or SPECT systems.

To overcome these shortcomings, energy discriminating, direct conversion detectors capable of not only x-ray counting, but of also providing a measurement of the energy level of each x-ray detected have been used in CT systems. A drawback of direct conversion semiconductor detectors, however, is that these types of detectors cannot count at the x-ray photon flux rates typically encountered with conventional CT systems. That is, the CT system requirements of high signal-to-noise ratio, high spatial resolution, and fast scan time dictate that x-ray photon flux rates in a CT system be very high, e.g. at or greatly exceeding 1 million x-rays per sec per millimeter squared.

Also, the count rate in a single detector pixel, measured in counts per second (cps) and determined by the flux rate, the pixel area, and the detection efficiency, is very high. The very high x-ray photon flux rate causes pile-up and polarization. "Pile-up" is a phenomenon that occurs when a source flux at the detector is so high that there is a non-negligible possibility that two or more x-ray photons deposit charge packets in a single pixel close enough in time so that their signals interfere with each other. Pile-up phenomenon is of two general types, which result in somewhat different effects. In the first type, the two or more events are separated by sufficient time so that they are recognized as distinct events, but the signals overlap so that the precision of the measurement of the energy of the later arriving x-ray or x-rays is degraded. This type of pile-up results in a degradation of the energy resolution of the system.

In the second type of pile-up, the two or more events arrive close enough in time so that the system is not able to resolve them as distinct events. In such a case, these events are recognized as one single event having the sum of their energies and the events are shifted in the spectrum to higher energies. In addition, pile-up leads to a more or less pronounced depression of counts in high x-ray flux, resulting in detector quantum efficiency (DQE) loss.

Direct conversion detectors are also susceptible to a phenomenon called "polarization" where charge trapping inside the material changes the internal electric field, alters the detector count and energy response in an unpredictable way, and results in hysteresis where response is altered by previous exposure history. This pile-up and polarization ultimately leads to detector saturation, which as stated above, occurs at relatively low x-ray flux level thresholds in direct conversion sensors. Above these thresholds, the detector response is not predictable and has degraded dose utilization that leads to loss of imaging information and results in noise and artifacts in x-ray projection and CT images. In particular, photon counting, direct conversion detectors saturate due to the intrinsic charge collection time (i.e. dead time) associated with each x-ray photon event. Saturation will occur due to pulse pile-up when x-ray photon absorption rate for each pixel is on the order of the inverse of this charge collection time.

Previously conceived approaches to enable photon counting at high x-ray flux rates include using bowtie shaped filters to pre-shape the profile of the flux rate along the detector, compensating for the patient shape and producing a smaller dynamic range of flux across the field of the detector. What can be problematic, however, is that the bowtie filter may not be optimal given that a subject population is significantly less than uniform and can vary in shape. In such cases, it is possible for one or more disjointed regions of saturation to occur or conversely to over-filter the x-ray flux and create regions of very low flux. Low x-ray flux in the projection will ultimately contribute to noise in the reconstructed image of the subject.

Another proposed approach to accommodate high flux rates has been to subdivide the pixel into multiple sub-pixels, each sub-pixel connected to its own preamplifier. By reducing the area of the direct conversion sub-pixel, the flux rate capability may be increased as fewer photons are collected in the smaller area. However, the signal-to-noise ratio of the resulting signal may be reduced, and the level of cross-talk will be disadvantageously significant due to the increased perimeter between sub-pixels. Crosstalk in a direct conversion detector takes the form of charge sharing between pixels for x-rays that are absorbed near the boundaries between pixels. Charge sharing may cause the photon to be missed entirely or mislabeled in energy. In either case, the DQE is decreased and spectral response is of reduced fidelity as a result of using subdivided pixels, each connected to its own amplifier.

A photon counting output readout for solid-state photomultiplier devices is available in a few prototype circuits based on the typical approach with scintillator coupling. Several patents in this area have been issued to the group of K. Burr and J. Short at General Electric Company, for example, referring to J. D. Short, G. E. Possin, J. W. Le Blanc, R. G. Rodrigues, K. C. Burr, A. J. Couture, W. Li, "Photon counting CT Detector Using Solid-State Photomultiplier And Scintillator", U.S. Pat. No. 7,403,589 B1.

When a solid-state photomultiplier device is used in a particular CT readout approach, the pile-up phenomenon is present at the output signal with a duration of about 50-200 ns, thus pulses generated by distinct received photons are overlapped and this may cause saturation of the respective amplifier.

SUMMARY OF THE INVENTION

A photon counting energy discriminating CT detector, to be capable of preventing saturation at the x-ray photon flux rates typically found in conventional CT systems, should generate very short pulses with high gain and low noise. This would prevent superposition of pulse waveforms, thus an accurate counting of received photons and a reliable estimation of their energy. This is accomplished in an effective and efficient manner in a photo detector array of Geiger mode avalanche photodiodes disclosed herein.

The sensing structure of the photo detector array of the present embodiments includes a plurality of Geiger mode avalanche photodiodes, e.g. as disclosed in Italian patent application No. VA2010A000026 (and shown in FIG. 1), assigned to the present application's assignee, the content of which is hereby incorporated by reference in its entirety.

An aspect of the photo detector array of the present embodiments is that all the parts or portions of a distinctive distributed anode contact of all the distinct elementary sensing structures of the array are connected to a common anode current collecting grid, which is patterned in a front metallization layer in a way as to have a minimal foot-print over the front area of the photo detector array. Also, all of the elementary sensing structures of the multi pixel array share a common rear cathode contact.

The photo detector array of the present embodiments is configured to generate pulses with short rise and fall times because each Geiger mode avalanche photodiode includes an anode contact, a cathode contact, an output contact electrically insulated from the anode and cathode contacts, a semiconductor layer, and at least one metal structure in the semiconductor layer capacitively coupled to the semiconductor layer and coupled to the output contact. The output contacts of all Geiger mode avalanche photodiodes are connected in common and are configured to provide for detection of spikes correlated to avalanche events on any avalanche photodiode of the array.

Such a photo detector array of the present embodiments may be used for realizing computed tomography systems.

DETAILED DESCRIPTION OF THE PREFERRED EMBODIMENTS

Figure 1:
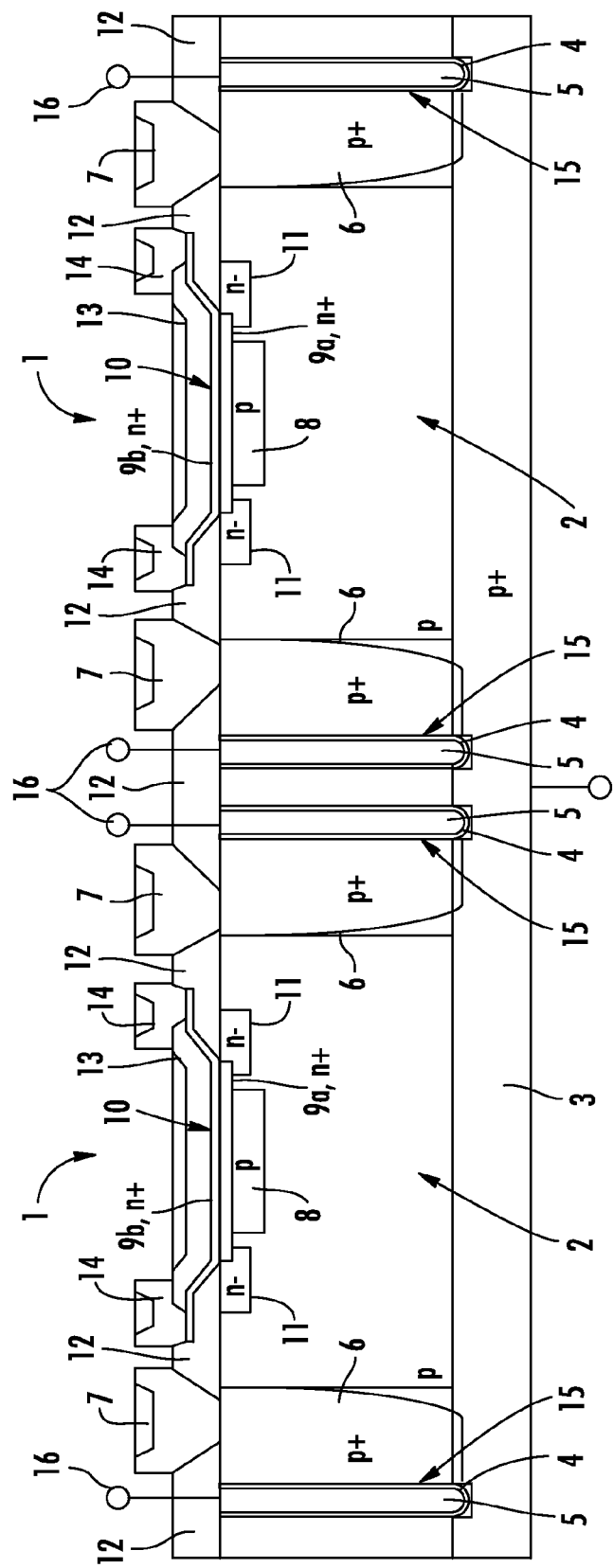
FIG. 1 is a cross-sectional view depicting two nearby Geiger mode avalanche photodiodes, e.g. as disclosed in the prior Italian patent application No. VA 2010A000026.

An exemplary structure of an array of Geiger-mode avalanche photodiodes (GMAP) is schematically illustrated in FIG. 1. In the depicted example, only two photodiodes are shown, though the array may comprise any number of photodiodes organized in rows and columns. The avalanche photodiode has three terminals instead of two: a cathode contact 14, an anode contact 7, a metal structure 5 having an output terminal 16 on which spikes correlated to avalanche events of the photodiode may be sensed. The metal structure 5 is defined in a trench coated with a dielectric 4, preferably silicon oxide, and is thus capacitively coupled with a region of the photodiode, that in the shown example is the anode diffusion 6.

The GMAP active area is defined by the p enrichment diffusion 8 (anode); this enrichment diffusion 8 identifies also the high electric field active region. The anode is contacted by a metal bus connected to p+ anode contact layer 6 or by a back-side metallization of the p+ substrate 3.

A deposition of n+ thin polysilicon layer 9 *b*, n+ doped with arsenic and a diffusion 9 *a*, n+ realize the cathode layer. A metal bus 14 is used to contact the cathode layer 9. To avoid edge breakdown problem, it may be necessary to realize an effective edge structure for the p-n junction of each pixel 1. One approach is creating a localized zone 8 of enhanced doping anode below the cathode. The other possibility is to create a depletion ring 11 around the cathode. In the shown preferred embodiment, both the zone 8 and the depletion ring 11 are present.

In this embodiment, a deposition of doped polysilicon and a diffusion 9 *a*, n+ to realize a cathode layer is used. With this technique, direct implantation of silicon is avoided, thus reducing defects. There is the possibility of combining the deposition of doped polysilicon and ionic implantation to obtain a polysilicon with a different doping concentration, thus realizing an integrated quenching resistor 10, directly connected to the cathode metallization.

Another possibility to realize integrated quenching resistors is the use of a dedicated conductive layer with properly determined resistivity, for example, a second deposition of doped polysilicon. To reduce the crosstalk effect between nearby GMAPs, a biased trench 15 cut into silicon, first oxidized 4 and then filled with metal 5, is realized. This trench 15 fully surrounds each GMAP 1 and is connected to the trenches 15 of the nearby GMAPs on the same column. The trench 15 acts, with the metal filling 5, against the photons flow and, with the oxide coat 4, against the electron flow. To further reduce the crosstalk electron flow, it is possible to surround each diode 1 with a substrate 3 and a p+ anode contact layer 6, where the electron life-time is very short.

According to a common bias technique, the anode is referred to ground and the photodiodes are inversely (negatively) biased with an inverse (reverse) bias voltage V-bias. When a photon impinges on the exposed surface of a photodiode, an avalanche current flows therethrough and also through the anode resistive diffusion capacitively coupled to the metal structure. Therefore, a sudden raise of the avalanche current causes a current spike on the metal structure 5.

Because the multiplication process above breakdown presents a self-sustaining mechanism, a quenching circuit, active or passive, has to be used to reset the photodiode and to make it ready to detect another photon. The passive quenching basically includes a large resistance value resistor in series with the GMAP. When the GMAP is fired by a photon, the avalanche current flows on the resistor and so the bias on the photodiode is lowered to a point that the multiplication chain is not self-sustained anymore and the avalanche is quenched. The bias on the photodiode then starts to increase again with an exponential rise, making the GMAP ready for detecting another photon. As already discussed in the cited prior Italian patent application, breakdown phenomena triggered by impinging photons cause the generation of relatively great spikes that may be detected without any amplification.

According to a present embodiment, in the photo detector array all the Geiger mode avalanche photodiodes are connected such to have a common anode contact and a common cathode contact. Differently from the photo detector array disclosed in the cited prior Italian patent application, the array has a common output contact 16 to which all shield/metal structures 5 are connected.

When a photon impinges on a photodiode, only that photodiode is activated and generates a breakdown current, while the other photodiodes remain off. Since all photodiodes of the array have corresponding terminals connected in common, the off photodiodes behave as a load of the unique photodiode activated by the impinging photon.

Figure 2:
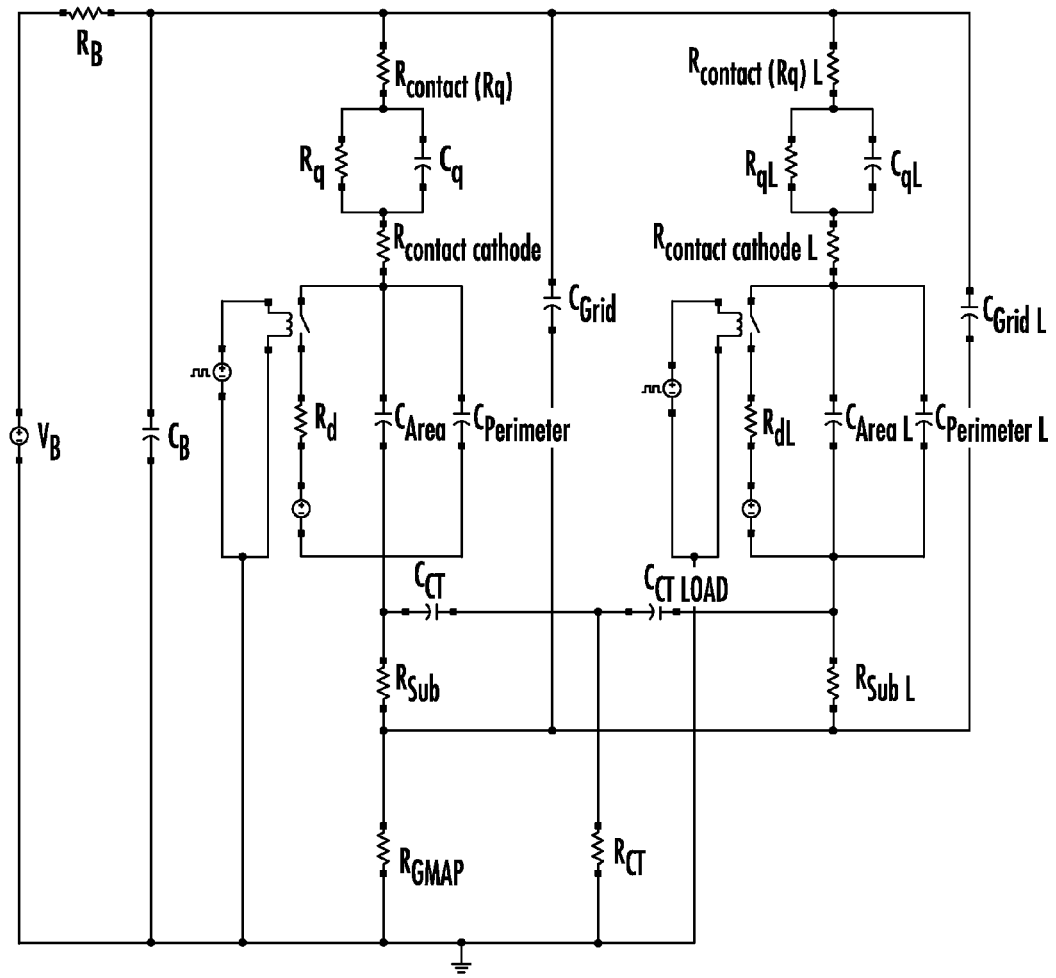
FIG. 2 is a schematic diagram illustrating an equivalent circuit of a photo detector array including two identical Geiger mode avalanche photodiodes having a common anode contact, a common cathode contact and having the output terminals connected to a common output contact of the array, in accordance with the present embodiments.

As shown in FIG. 2, depicting the equivalent circuit of two Geiger mode avalanche photodiodes of FIG. 1 having a common anode contact, a common cathode contact and a common output contact 16 to which all metal shields 5 are connected, each off photodiode may be modeled as a parallel connection between a resistance $R_d$ and a capacitance $C_d$. The resistance $R_d$ is the sum of the resistances of the single layers crossed by current spikes that reach the common anode contact. The diode capacitance $C_d$ is the parallel between the capacitance of the depletion layer area $C_{Area}$ and of the perimeter $C_{Perimeter}$. The quenching resistor $R_q$ integrated into the cell is associated with the capacitance $C_q$, made in turn by the parallel between the two capacities $C_{q1}$ e $C_{q2}$, taking into account the two different oxide thicknesses below the resistor itself.

The circuit of FIG. 2 also takes into account parasitic effects in the structure, such as the contact resistances and the substrate resistances. The resistance $R_{contact}$ cathode is the contact resistance introduced by the metal bridge connecting the quenching resistor to the polysilicon n+ layer, the substrate resistance $R_{sub}$ is connected between the diode anode and the contact anode. Other parasitic parameters, considered in the circuit model of the single cell, are $R_{contact\,(Rq)}$ and $C_{mtl}$. The $R_{contact\,(Rq)}$ is the contact resistance between the cathode used to bias the cell, and the quenching resistor $R_q$. The $C_{mtl}$ is the capacitance between the metallization of the cathode and the anode terminal. In addition, a typical polarization circuit is illustrated on the left side.

The capacitance $C_{CT}$ and the resistance $R_{CT}$ represent respectively the capacitance and the resistance between the common anode contact and the metal shield 5 of the active photodiode. The capacitance $C_{CTLOAD}$ is the corresponding capacitance between the common anode contact and the metal shield 5 of the off photodiodes. Since all the output terminals 16 of the photodiodes of the array are connected in common, the off photodiodes behave as capacitors connected electrically in parallel to the electrical path crossed by the current spike generated by the on photodiode activated by the impinging photon. For this reason, the herein disclosed array of Geiger mode avalanche photodiodes is capable of generating sharp current spikes at every photon detection.

Figure 3:
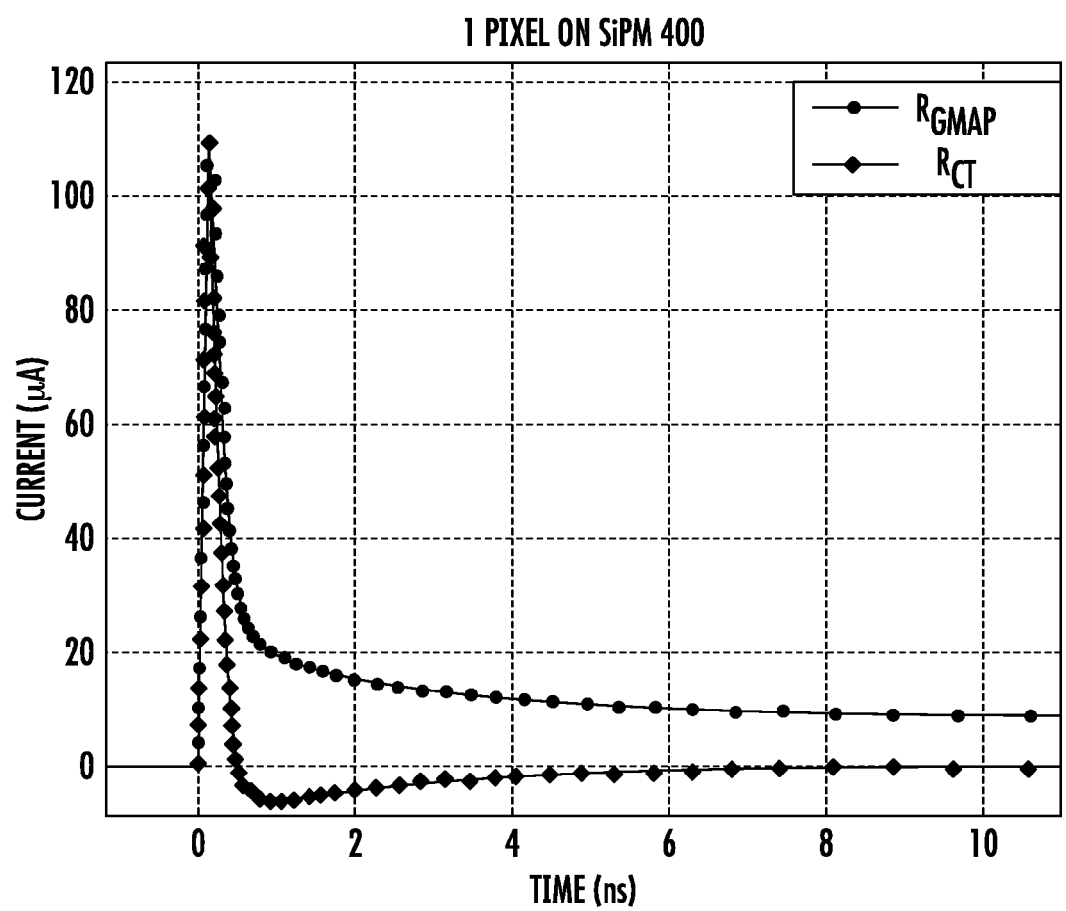
FIG. 3 is an exemplary time graph illustrating a comparison between the current spikes that would be generated on a common output contact of a photo detector array of the present embodiments (ROT) and on the output contact of a single Geiger mode avalanche photodiode (RGMAP) when a photon is received.

FIG. 3 compares exemplary current spikes obtained, through simulations, using the present photo detector array of Geiger mode avalanche photodiodes ($R_{CT}$) and using an array of Geiger mode avalanche photodiodes for imaging purposes ($R_{GMAP}$).

Figure 4:
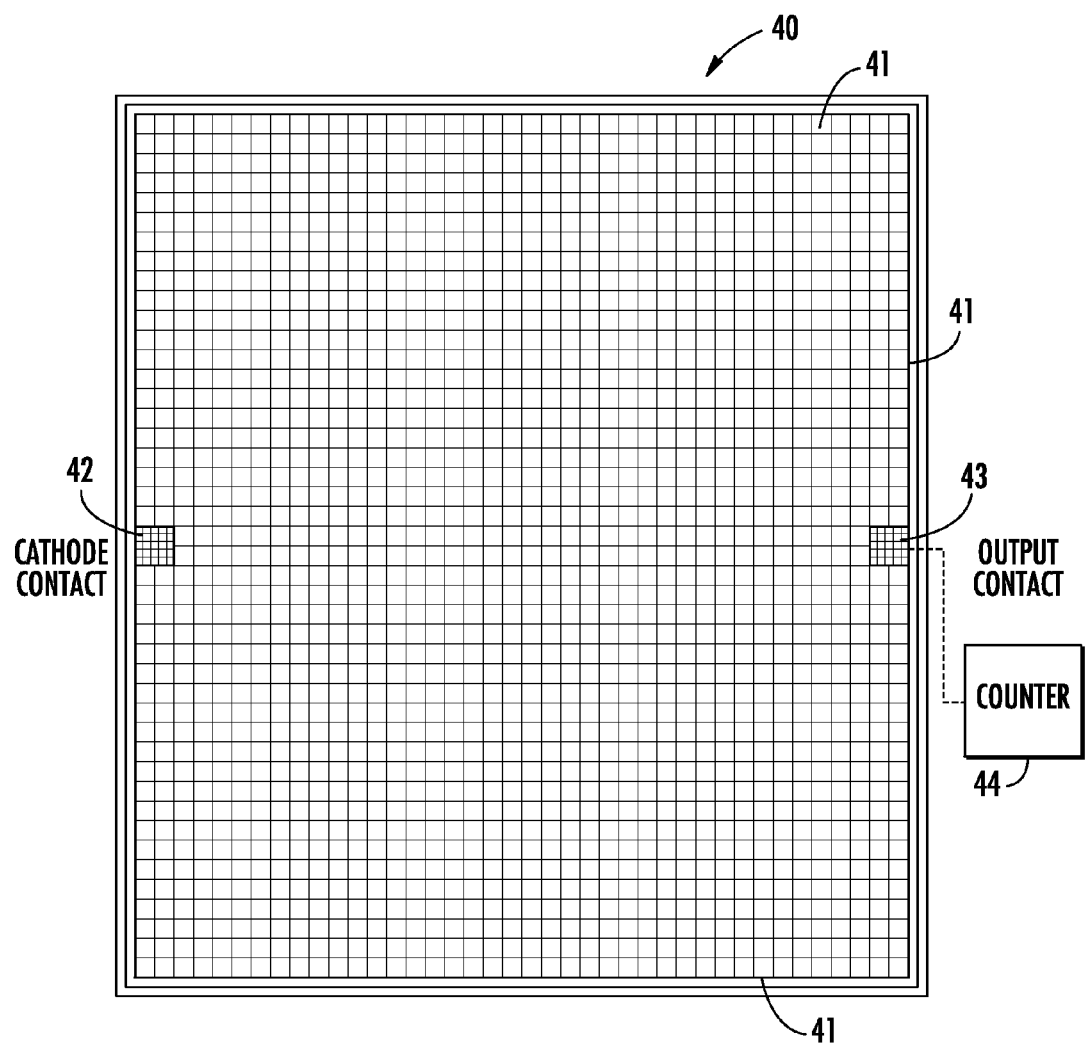
FIG. 4 is a top view of a layout of a photo detector array of Geiger mode avalanche photodiodes in which the terminals of the shield/metal structures of the photodiodes are connected to a common output contact.
Figure 5:
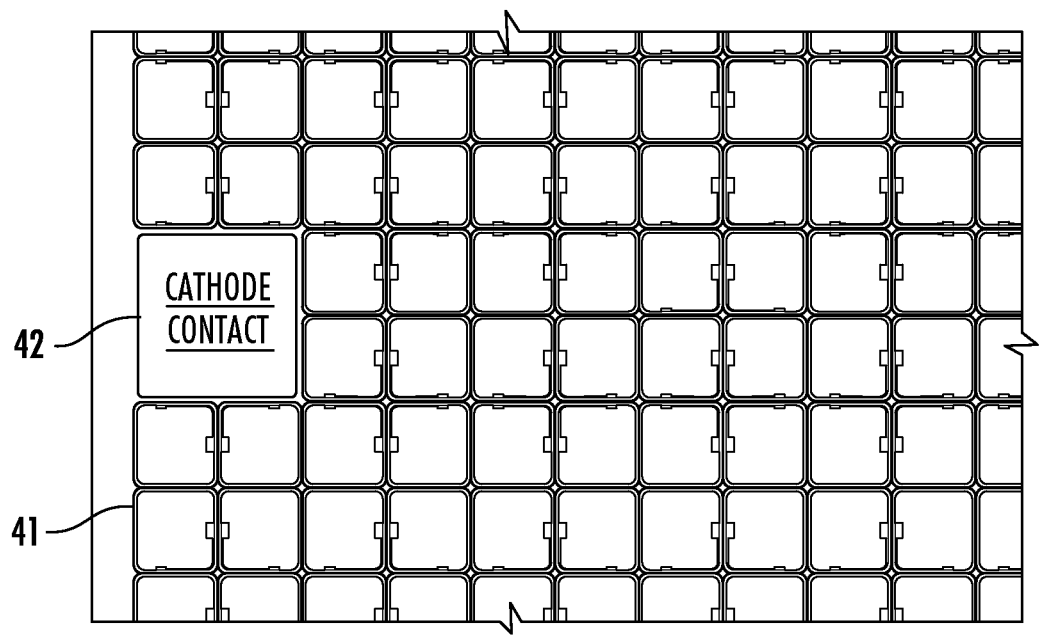
FIG. 5 is a more detailed view of the layout of the photo detector array of FIG. 4 corresponding to the common cathode contact to which all cathode terminals of the photodiodes are connected.
Figure 6:
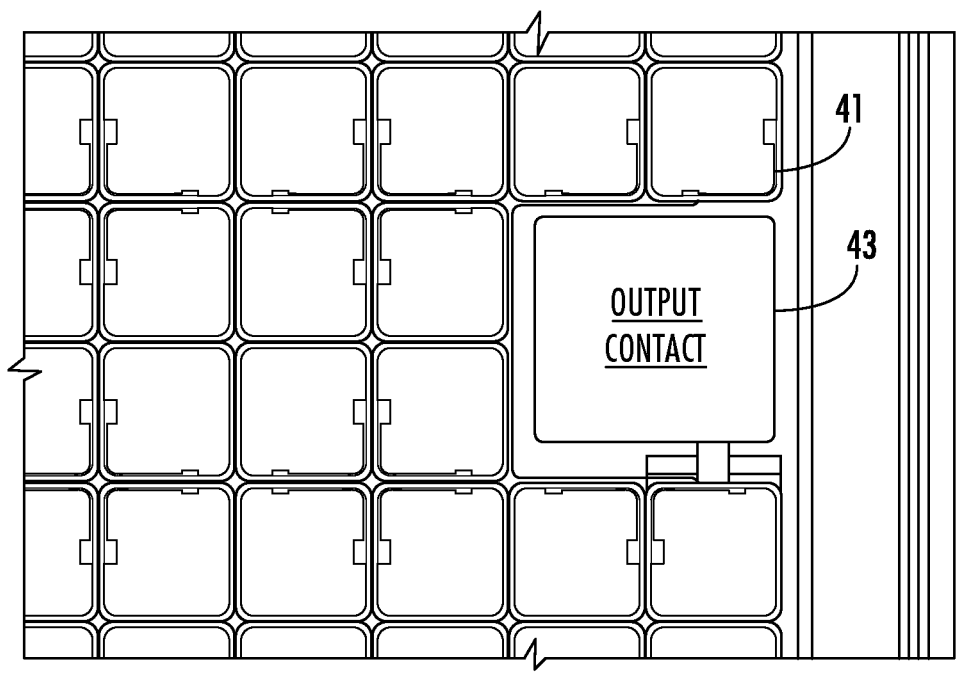
FIG. 6 is a more detailed view of the layout of the photo detector array of FIG. 4 corresponding to the common output contact to which the terminals of all shield/metal structures of the photodiodes are connected.

FIGS. 4 to 6 are top views of an exemplary layout of the photo detector array 40, in which all cathode terminals of the photodiodes 41 are connected to a common cathode contact 42 and all shield/metal structures are connected to a common output contact 43.

Current spikes generated by the array of Geiger mode avalanche photodiodes for imaging purposes ($R_{GMAP}$), after the current peak, show a transient tail that decreases relatively slowly to zero. If another photon impinged during this transient phase, the transient tail current of the second current spike would sum up to the preceding tail current and this would cause a saturation effect. By contrast, the herein disclosed array of Geiger-mode avalanche photodiodes generates current spikes of substantially identical amplitude, though with very shorter fall times. Therefore, the activated photodiode immediately turns off and is ready to detect another impinging photon.

The present photo detector array 40 may be used to realize computed tomography systems, that have a counter 44 configured to count spikes on the common output contact 43 of the Geiger mode avalanche photodiodes 41.

That which is claimed:

1. A photodetector array comprising:
   a semiconductor substrate;
   an array of Geiger mode avalanche photodiodes on the semiconductor substrate configured to detect radiation, each Geiger mode avalanche photodiode comprising
      an anode contact,
      a cathode contact,
      an output contact electrically insulated from said anode and cathode contacts,
      a semiconductor layer,
      a front side metallization layer on the semiconductor layer, and
      at least one shield structure in said semiconductor layer capacitively coupled to said semiconductor layer and coupled to said output contact;
   a first connection lead defined by a common cathode contact of the array photodiode cathode contacts;
   a second connection lead defined by a common anode collecting grid contact, patterned in the front side metallization layer of the semiconductor layer, connecting in common the anode contacts of the array photodiodes; and
   an array output defined by the array photodiodes output contacts connected in common.

2. The photodetector array of claim 1 wherein, in each Geiger mode avalanche photodiode, said semiconductor layer further comprises a first doped anode region of a first type of conductivity in said semiconductor layer.

3. The photodetector array of claim 2 wherein, in each Geiger mode avalanche photodiode, said at least one shield structure comprises:
   a first metal layer extending from a front surface of said semiconductor layer to reach said first doped anode region for lateral shielding; and
   an insulating layer on said first metal layer.

4. The photodetector array of claim 3 wherein, in each Geiger mode avalanche photodiode, said semiconductor layer further comprises:
   a cathode region of a second type of conductivity and a respective second cathode metallization layer coupled thereto; and
   a second doped anode region of the first type of conductivity surrounding said cathode region and extending from a front surface of said semiconductor layer to said first doped anode region.

5. The photodetector array of claim 4 wherein each Geiger mode avalanche photodiode further comprises a third metal layer coupling said first metal layer to said output contact.

6. The photodetector array of claim 5 wherein, each Geiger mode avalanche photodiode further comprises a fourth anode metallization layer defined on the front surface of said semiconductor layer and coupled to said second doped anode region.

7. The photodetector array of claim 6 wherein, in each Geiger mode avalanche photodiode, said semiconductor layer further comprise:
   a buried doped enrichment region of the first type of conductivity; and
   a doped depletion ring region of the second type of conductivity in said semiconductor layer and surrounding said buried doped enrichment region and extending up to the front surface of the semiconductor layer.

8. The photodetector array of claim 7 wherein, in each Geiger mode avalanche photodiode, said cathode region includes:
   a first doped cathode section extending from the front surface enclosed by said doped depletion ring region to said buried doped enrichment region to couple the doped depletion ring region to the buried doped enrichment region; and
   a second doped cathode section on said buried doped enrichment region, the second cathode metallization layer being defined on said second doped cathode region.

9. The photodetector array of claim 8 wherein, each Geiger mode avalanche photodiode further comprises a conductive layer to define a quenching resistor on said second doped cathode region, said second cathode metallization layer being defined at least in part on said conductive layer.

10. A computed tomography system comprising:
    a photodetector array including
       a semiconductor substrate,
       an array of Geiger mode avalanche photodiodes on the semiconductor substrate configured to detect radiation, each Geiger mode avalanche photodiode comprising
          an anode contact,
          a cathode contact,
          an output contact electrically insulated from said anode and cathode contacts,
          a semiconductor layer,
          a front side metallization layer on the semiconductor layer, and
          at least one shield structure in said semiconductor layer capacitively coupled to said semiconductor layer and coupled to said output contact,
       a first connection lead defined by a common cathode contact of the array photodiode cathode contacts,
       a second connection lead defined by a common anode collecting grid contact, patterned in the front side metallization layer of the semiconductor layer, connecting in common the anode contacts of the array photodiodes, and
       an array output defined by the array photodiodes output contacts connected in common; and
    a counter configured to count spikes corresponding to avalanche events on said array output of the Geiger mode avalanche photodiodes.

11. The computed tomography system of claim 10 wherein in each Geiger mode avalanche photodiode of the photodetector array, said semiconductor layer further comprises a first doped anode region of a first type of conductivity in said semiconductor layer.

12. The computed tomography system of claim 11 wherein in each Geiger mode avalanche photodiode of the photodetector array, said at least one shield structure comprises:
    a first metal layer extending from a front surface of said semiconductor layer to reach said first doped anode region for lateral shielding; and
    an insulating layer on said first metal layer.

13. A method of detecting radiation with a photodetector array, the method comprising:
    forming an array of Geiger mode avalanche photodiodes on a semiconductor substrate, each Geiger mode avalanche photodiode comprising an anode contact, a cathode contact, an output contact electrically insulated from the anode and cathode contacts, a semiconductor layer, a front side metallization layer on the semiconductor layer, and at least one shield structure in the semiconductor layer capacitively coupled to the semiconductor layer and coupled to the output contact;

coupling the array photodiode cathode contacts to a common cathode contact to define a first connection lead;

coupling the anode contacts of the array photodiodes to a common anode collecting grid contact, patterned in the front side metallization layer of the semiconductor layer, to define a second connection lead; and coupling in common the array photodiodes output contacts to an array output.

14. The method of claim 13 wherein, in each Geiger mode avalanche photodiode, the semiconductor layer further comprises a first doped anode region of a first type of conductivity in said semiconductor layer.

15. The method of claim 14 wherein, in each Geiger mode avalanche photodiode, said at least one shield structure comprises:

a first metal layer extending from a front surface of said semiconductor layer to reach said first doped anode region for lateral shielding; and an insulating layer on said first metal layer.

16. The method of claim 15 wherein, in each Geiger mode avalanche photodiode, said semiconductor layer further comprises:

a cathode region of a second type of conductivity and a respective second cathode metallization layer coupled thereto; and a second doped anode region of the first type of conductivity surrounding said cathode region and extending from a front surface of said semiconductor layer to said first doped anode region.

17. The method of claim 16 wherein each Geiger mode avalanche photodiode further comprises a third metal layer coupling said first metal layer to said output contact.

18. The method of claim 17 wherein, each Geiger mode avalanche photodiode further comprises a fourth anode metallization layer defined on the front surface of said semiconductor layer and coupled to said second doped anode region.

19. The method of claim 18 wherein, in each Geiger mode avalanche photodiode, said semiconductor layer further comprise:

a buried doped enrichment region of the first type of conductivity; and a doped depletion ring region of the second type of conductivity in said semiconductor layer and surrounding said buried doped enrichment region and extending up to the front surface of the semiconductor layer.

20. The method of claim 19 wherein, in each Geiger mode avalanche photodiode, said cathode region includes:

a first doped cathode section extending from the front surface enclosed by said doped depletion ring region to said buried doped enrichment region to couple the doped depletion ring region to the buried doped enrichment region; and a second doped cathode section on said buried doped enrichment region, the second cathode metallization layer being defined on said second doped cathode region.

* * * * *